(12) United States Patent
Kimura

(10) Patent No.: US 7,169,652 B2
(45) Date of Patent: Jan. 30, 2007

(54) METHOD OF MANUFACTURING ELECTRO-OPTICAL DEVICE, ELECTRO-OPTICAL DEVICE, TRANSFERRED CHIP, TRANSFER ORIGIN SUBSTRATE

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/670,275

(22) Filed: Sep. 26, 2003

(65) Prior Publication Data
US 2004/0126911 A1 Jul. 1, 2004

(30) Foreign Application Priority Data
Sep. 26, 2002 (JP) ............................. 2002-281856

(51) Int. Cl.
 *H01L 21/00* (2006.01)
 *H01L 21/22* (2006.01)
(52) U.S. Cl. ...................... 438/149; 438/455; 438/458
(58) Field of Classification Search ................ 438/149, 438/108, 455, 458, 118
See application file for complete search history.

(56) References Cited

U.S. PATENT DOCUMENTS

| 4,808,983 | A |   | 2/1989 | Benjamin et al. | |
|---|---|---|---|---|---|
| 5,459,081 | A | * | 10/1995 | Kajita | ........................ 438/25 |
| 2002/0096994 | A1 | * | 7/2002 | Iwafuchi et al. | ............. 313/495 |
| 2003/0087476 | A1 | * | 5/2003 | Oohata et al. | ............... 438/108 |

FOREIGN PATENT DOCUMENTS

| JP | 4-31299 | 3/1992 |
|---|---|---|
| JP | A 10-125931 | 5/1998 |
| JP | A 2002-182582 | 6/2002 |
| JP | A 2002-261335 | 9/2002 |
| JP | A 2002-311858 | 10/2002 |
| JP | A 2002-314052 | 10/2002 |
| JP | A 2002-314123 | 10/2002 |
| JP | A 2002-343944 | 11/2002 |
| JP | A 2002-368282 | 12/2002 |

(Continued)

OTHER PUBLICATIONS

Shimoda et al, "Surface Free Technology by Laser Annealing (SUFTLA)", IEDM 99-289 pp. 12.1.1-12.1.4.

(Continued)

*Primary Examiner*—Thanh Nguyen
(74) *Attorney, Agent, or Firm*—Oliff & Berridge, PLC

(57) ABSTRACT

The invention enhances a production yield of a display device (an electro-optical device). The invention provides a method of manufacturing an electro-optical device including a display region in which a plurality of basic pixels are arranged, each basic pixel including a plurality of color pixels. The method includes: forming on a first substrate lines to drive a plurality of electro-optical elements respectively constituting the color pixels, correspondingly to the arrangement of the basic pixels; forming on a second substrate, as a chip to be transferred to each basic pixel, a drive circuit to drive the plurality of electro-optical elements which constitutes the plurality of color pixels of the basic pixels to obtain a plurality of basic-pixel driving chips; and transferring step of transferring the respective basic-pixel driving chips from the second substrate onto the first substrate, and connecting the drive circuits to regions of the lines corresponding to the basic pixels.

14 Claims, 9 Drawing Sheets

FOREIGN PATENT DOCUMENTS

KR  2002-71986 A  9/2002

OTHER PUBLICATIONS

Utsunomiya et al., 36.2: Low Temperature Poly-Si TFTs on Plastic Substrate Using Surface Free Technology by Laser Ablation/Annealing (SUFTLA™), SID 00 Digest, pp. 916-919.

Shimoda, "Future Trend of TFTs", Asia Display/IDW '01, pp. 327-330.

Utsunomiya et al. Low Temperature Poly Si TFT-LCD Transferred onto Plastic Substrate Using Surface Free Technology by Laser Ablation/Annealing (SUFTLA®), Asia Display/IDW '01), pp. 339-342.

Utsunomiya et al. SUFTLA® (Surface Free Technology by Laser Ablation/Annealing), AM-LCD '02, pp. 37-40.

* cited by examiner

CROSS-SECTION TAKEN ALONG A-A'

CROSS-SECTION TAKEN ALONG B-B'

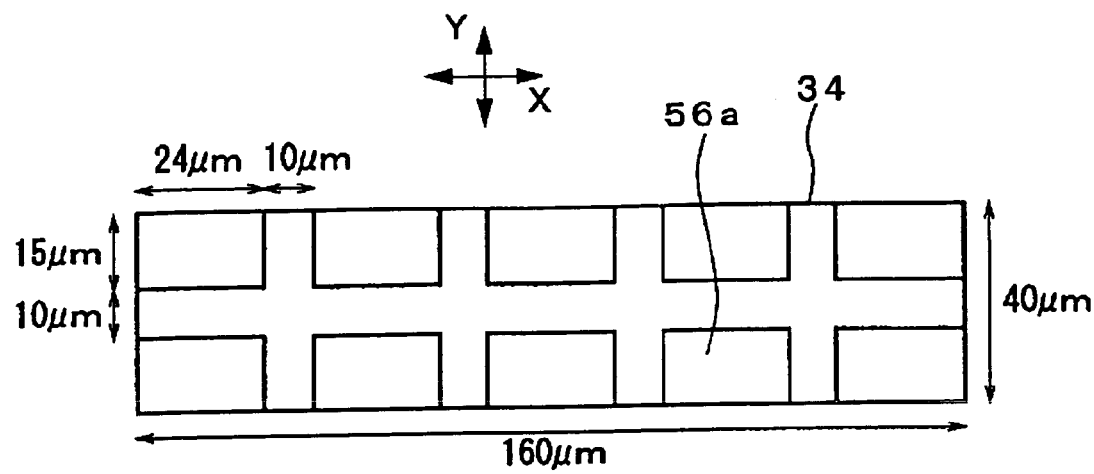
Fig. 6A  CASE OF ARRANGEMENT IN TWO LINES
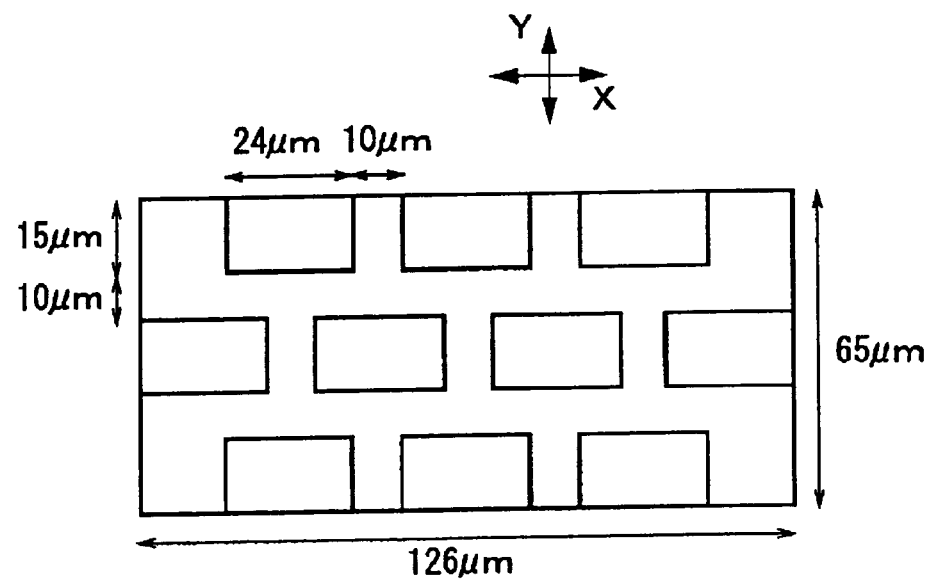
Fig. 6B  CASE OF ARRANGEMENT IN THREE LINES

METHOD OF MANUFACTURING ELECTRO-OPTICAL DEVICE, ELECTRO-OPTICAL DEVICE, TRANSFERRED CHIP, TRANSFER ORIGIN SUBSTRATE

BACKGROUND OF THE INVENTION

1. Field of Invention

The present invention relates to a display device (an electro-optical device) in which pixels are driven using elements, such as thin film transistors, or the like. The invention also relates to a method of manufacturing the same.

2. Description of Related Art

In display devices (electro-optical devices) using thin film transistors to drive pixels, such as liquid crystal display devices to be driven with thin film transistors, organic electroluminescent (EL) display devices to be driven with thin film transistors, light-emitting diode display devices to be driven with thin film transistors, electrophoresis display devices to be driven with thin film transistors or the like, the thin film transistors constitute only a part of the overall device, and lines, support substrates, etc., constitute or substantially constitute the remainder of the overall device. When these display devices (the display devices to be driven with thin film transistors) are manufactured by forming thin film transistors, the lines, and the support substrate into a single body through the same manufacturing process, since a difficult and complex manufacturing process is required to manufacture the thin film transistors, the manufacturing cost thereof is generally high. However, since the difficult and complex manufacturing process is not required only for the lines and the support substrate, the manufacturing cost thereof is low. Therefore, if the thin film transistors and the lines or support substrate can be manufactured separately and the thin film transistors can be arranged only in desired positions, the manufacturing cost of the display devices to be driven with thin film transistors can be reduced.

To address such a requirement, the related art includes a transfer method of forming elements in desired positions on a transfer destination base substrate, by forming a transferred layer including elements, such as thin film transistors, inserting a peeling layer between the transferred and the transfer origin base substrate, attaching it to a transfer destination base substrate, irradiating light into the peeling layer to peel off the peeling layer and to separate the transfer origin base substrate from the peeling layer. Such a transfer method is disclosed, for example, in Japanese Unexamined Patent Application Publication No. 10-125931. Since the thin film transistors can be formed only in desired positions using the aforementioned transfer method, the manufacturing cost of the display device to be driven with thin film transistors can be reduced as a whole. Further, at that time, the peeling-off or transferring process employs laser ablation or adhesive, as disclosed in (T. Shimoda, et al, Techn. Dig. IEDM 1999, 289, S. Utsunomiya, et al, Dig. Tech. Pap. SID 2000, 916, T. Shimoda, Proc. Asia Display/IDW'01, 327, S. Utsunomiya, et al, Proc. Asia Display/IDW'01, 339, S. Utsunomiya, et al, AM-LCD'02, to be presented).

SUMMARY OF THE INVENTION

When the display device is manufactured using the aforementioned transfer method, production yield is inclined to be decreased with increase in the number of transferred bodies which are targets to be transferred from a transfer origin base substrate to a transfer destination base substrate.

Although electrical connections between elements included in the transferred bodies and lines included in the transfer destination base substrate may be made by previously forming pads (connection terminals serving as the electrical connections) on the transferred bodies and the transfer destination base substrate correspondingly to each other, in this case, the production yield is inclined to be decreased with increase in the number of pads.

Furthermore, since the number of transferred bodies capable of being formed on the transfer origin base substrate can be increased and decreased with largeness and smallness of an area of each transferred body, the manufacturing cost may depend upon the area.

Therefore, the present invention enhances the production yield of a display device.

Further, the present invention reduces the manufacturing cost of a display device.

In order to address or accomplish the above, the present invention provides a method of manufacturing an electro-optical device including a display region in which a plurality of basic pixels are arranged, each basic pixel including a plurality of color pixels. The method includes: a substrate line forming step of forming the lines on a first substrate to drive a plurality of electro-optical elements respectively constituting the color pixels, correspondingly to the arrangement of the basic pixels; a basic-pixel driving-chip forming step of forming on a second substrate, as a chip to be transferred to each basic pixel, a drive circuit to drive the plurality of electro-optical elements which constitutes the plurality of color pixels of each basic pixel to obtain a plurality of basic-pixel driving chips; and a basic-pixel driving-chip transferring step of transferring the respective basic-pixel driving chips from the second substrate onto the first substrate, and connecting the drive circuits to regions of the lines corresponding to the basic pixels.

The "electro-optical elements" in the present invention include elements, such as electroluminescent (EL) elements, electrical emission elements, plasma emission elements, electrophoresis elements, liquid crystal elements, LEDs, or the like. Further, in the present invention, "as a chip transferable" means that the respective basic-pixel driving chips (transferred bodies) are formed on a second substrate to allow the respective basic-pixel driving chips to be physically dividable in order to be individually targets for transfer, but is not necessarily limited to separation (or division) into a single chip.

For example, when one basic pixel includes three-color pixels, it can be considered that the elements (transferred bodies), such as thin film transistors, are transferred correspondingly to each of the three-color pixels. In this case, the number of transfers for the respective basic pixels is 3.

On the contrary, in the present invention, since the basic-pixel driving chips, in which functions of driving the plurality of color pixels included in one basic pixel are incorporated into one chip, are formed on the second substrate and then the peeling and transferring is performed, the number of transfers for the respective basic pixels is 1. That is, in the present invention, since the number of transferred bodies can be decreased and the number of transfers can be reduced, it is easy to reduce or avoid disadvantages, such as transfer failure, so that it is possible to enhance the production yield.

Preferably, each of the basic-pixel driving chips includes a plurality of control devices to individually control operating conditions of the plurality of electro-optical elements.

The respective control devices can be implemented by constructing circuits active elements, such as thin film transistors, of which are formed as a single body, or the active elements of which are formed plurally, or the active elements of which are properly combined with passive elements, such as capacitors. By providing the control devices to correspond to the respective electro-optical elements one to one, the configuration of the drive circuit included in the basic-pixel driving chip can be simplified, thereby facilitating the design or manufacture.

Preferably, each of the control devices includes a first transistor to control current flowing in the electro-optical element and a second transistor to operate the first transistor in accordance with input signals.

Like the above, by constructing different transistors serving a function of supplying a driving current to an electro-optical element and a function of controlling a selection/non-selection condition of the electro-optical element, respectively, it is possible to implement a basic-pixel driving chip that is very suitable to drive electro-optical elements (for example, EL elements, etc.) requiring relative large driving current.

Preferably, a gate electrode of the second transistor included in each of the control devices is connected to a common line passing through each of the control devices.

By doing so, since the number of lines can be reduced compared with a case in which lines are provided individually in the gate electrodes of the second transistors, it is possible to reduce a chip size of the basic-pixel driving chip. As a result, since more basic-pixel driving chips, which are transferred bodies, can be formed on the transfer origin substrate (second substrate), it is possible to reduce the manufacturing cost. Furthermore, reduction of the number of lines allows the degree of freedom in designing the layout of lines in chips to be increased.

Furthermore, since the connection positions to electrically connect external devices to the drive circuit provided in the basic-pixel driving chip become small, it is possible to decrease the chip size. Furthermore, a decrease in the connection positions allows the frequency of connection failure in transfer to be decreased. For these reasons, it is possible to enhance the production yield or to reduce the manufacturing cost.

Preferably, each of the basic-pixel driving chips includes a plurality of first connection terminals serving as electrical connection to the basic-pixel driving chip; the first substrate includes a plurality of second connection terminals provided in regions to which the basic-pixel driving chips are transferred in one-to-one correspondence with the first connection terminals and serving for electrical connection to the lines; in the basic-pixel driving-chip transferring step, the electrical connection between the basic-pixel driving chips and the first substrate is accomplished by carrying out the transferring to bring the plurality of first and second connection terminals into contact with each other; and each of the first connection terminals and each of the second connection terminals are allocated to the common line included in the basic-pixel driving chip and to the lines on the first substrate to be electrically connected to the common line, respectively.

By doing so, since the number of connection terminals (pads) serving for electrical connection can be reduced, it is possible to enhance the production yield due to decrease in the connection positions. Furthermore, the chip size of the basic-pixel driving chip can be decreased, and thus it is possible to reduce the manufacturing cost.

Preferably, the basic-pixel driving-chip transferring step includes: forming an adhesive layer on at least one side of the first connection terminals formed in the basic-pixel driving chips or the second connection terminals formed on the first substrate. By doing so, it is possible to more firmly connect the first and second connection terminals.

Preferably, the plurality of first connection terminals is spaced from one another by a predetermined distance, and also is arranged in two lines along one direction of the basic-pixel driving chip. By doing so, since the area required for arrangement of the plurality of first connection terminals can be decreased, it is possible to reduce the chip size of the basic-pixel driving chip. Furthermore, by arranging the first connection terminals as described above, it is possible to decrease the area required for arrangement of the second connection terminals which should be arranged in one-to-one correspondence with the first connection terminals.

Preferably, the basic-pixel driving-chip forming step includes: forming a peeling layer interposed between the second substrate and the basic-pixel driving chips, the peeling layer having a feature that application of energy causes a phase transformation to weaken the bonding strength to the basic-pixel driving chips. By doing so, it is easy to peel off the basic-pixel driving chips from the second substrate in transfer. Furthermore, it can be considered that various methods, such as a method of applying heat or a method of irradiating light, are used as a method of applying energy, and the method of irradiating light using laser light is specifically preferable. According to the light irradiation method, energy can be applied to any region and in addition accurate positioning is possible.

Furthermore, the present invention provides a transferred chip to be used to manufacture an electro-optical device in which a plurality of basic-pixel circuits are arranged on a wiring substrate. The transferred chip includes: drive circuits to drive the basic-pixel circuits; and a plurality of connection terminals to connect the wiring substrate to the drive circuits. The plurality of connection terminals are formed in patterns of two lines all over a transfer surface of the transferred chip.

The "transferred chip" means a minimum unit as a transferred body in using the aforementioned transfer technique, specifically, the separation and transfer technique in which a transferred body is first formed on a substrate which is a transfer origin, and then the transferred body is transferred onto a transfer destination substrate (for example, a substrate constituting the final product) other than the transfer origin substrate, and the transferred chip includes a circuit including various elements or combination of them to serve for a predetermined function.

By the aforementioned construction according to the present invention, the area required for arrangement of the plurality of connection terminals can be decreased, and as a result, it is possible to reduce the chip size of the transferred chip. For this reason, since more basic-pixel driving chips, which are the transferred bodies, can be formed on the transfer origin substrate (second substrate), it is possible to reduce the manufacturing cost.

Preferably, the basic-pixel circuits include a plurality of electro-optical elements constituting a plurality of color pixels, respectively, and the drive circuits drive and control each of the plurality of electro-optical elements. As a result, configuration of the drive circuit is simplified to facilitate a design or a manufacture thereof, so that it is possible to accomplish reduction of the manufacturing cost.

Furthermore, the present invention provides a transfer origin substrate constructed by forming a plurality of the aforementioned transferred chips according to the present invention on a substrate. Furthermore, it is preferable that the transfer origin substrate further include a peeling layer interposed between the substrate and the transferred chips, the peeling layer having a feature that application of energy thereto causes a phase transformation to weaken the bonding strength to the transferred chips.

Furthermore, the present invention provides an electro-optical device manufactured using the aforementioned manufacturing method. Further, the present invention provides an electro-optical device manufactured using the aforementioned transferred chip or the aforementioned transfer origin substrate. As a result, it is possible to reduce the cost and the production yield for the electro-optical device. Furthermore, in the present invention, the "electro-optical device" includes display devices including various electro-optical elements, such as electroluminescent (EL) elements, electrical emission elements, plasma emission elements, electrophoresis elements, liquid crystal elements or the like.

Furthermore, the present invention provides an electronic apparatus using the aforementioned electro-optical device according to the present invention as a display unit. The electronic apparatus includes a video camera, a portable phone, a personal computer, a portable information terminal device (so-called PDA), or various other types of devices. By using the electro-optical device according to the present invention, since the display unit can be constructed with low cost, it is possible to decrease the cost for the electronic apparatus.

BRIEF DESCRIPTION OF THE DRAWINGS

FIGS. 6A and 6B are schematics illustrating arrangement of the respective pads provided on the chip;

DETAILED DESCRIPTION OF PREFERRED EMBODIMENTS

A structure and a manufacturing method of a display device to be driven with thin film transistors according to an exemplary embodiment of the present invention is described in detail below. In this exemplary embodiment, an organic EL display device is described as an example of the display device to be driven with thin film transistors.

Figure 1:
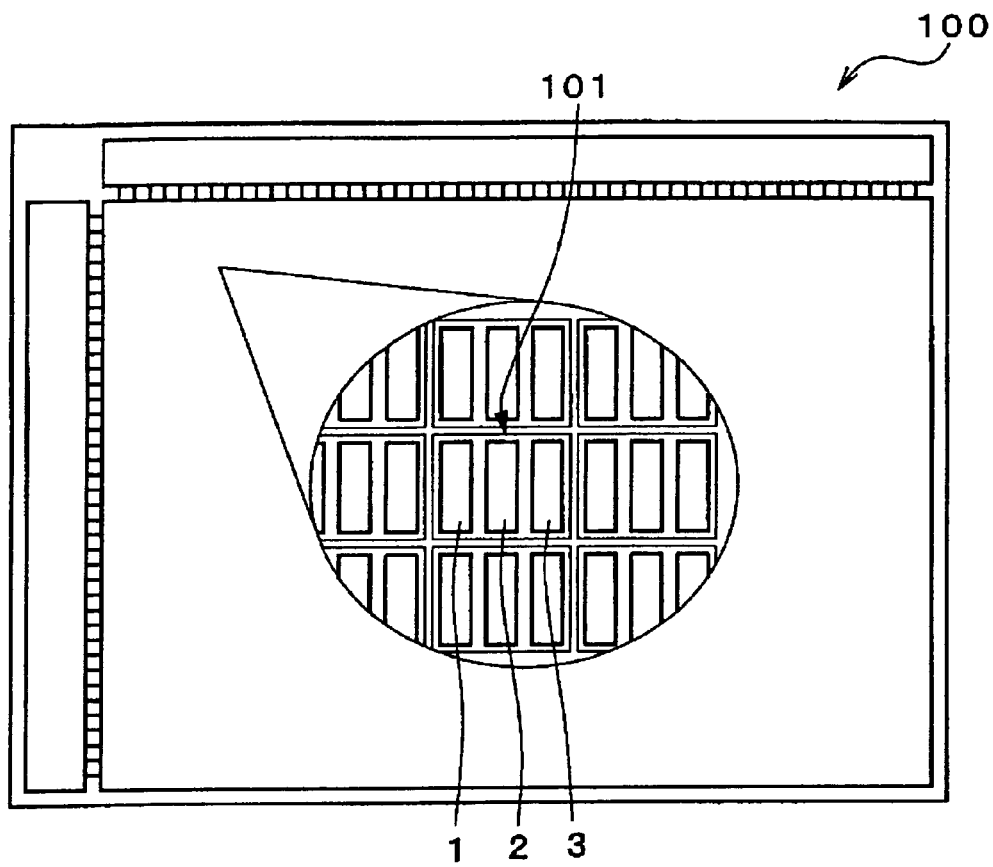
FIG. 1 is a schematic illustrating a configuration of an organic EL display device.

FIG. 1 is a schematic illustrating a configuration of the organic EL display device according to this exemplary embodiment. In the organic EL display device 100 shown in FIG. 1, a plurality of pixels (basic pixels) 101, each of which includes three-color pixels 1, 2, 3, is arranged in a matrix shape.

Among the color pixels, for example, the color pixel 1 corresponds to a red color, the color pixel 2 corresponds to a green color, and the color pixel 3 corresponds to a blue color. The respective pixels 101 are driven by chips having a drive circuit built in, the drive circuit including a plurality of thin film transistors (TFTs).

Figure 2A:
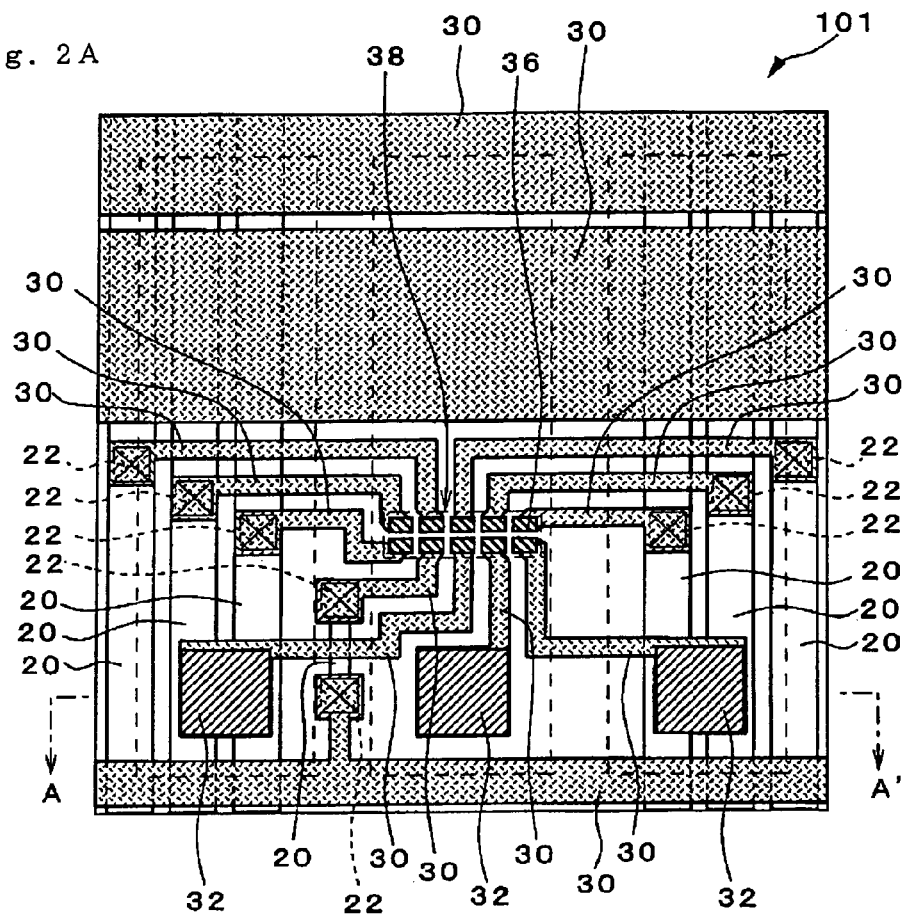
FIGS. 2A and 2B are schematics illustrating a structure of a pixel.
Figure 2B:
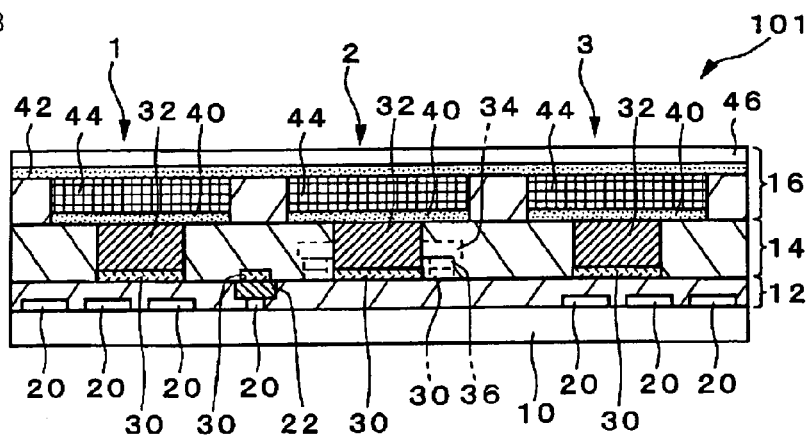

FIGS. 2A and 2B are schematics illustrating a structure of the pixel 101. FIG. 2A is a plan view of the pixel 101, and FIG. 2B is a cross-sectional view taken along a plane A–A' in FIG. 2A. Further, in FIG. 2A, some elements are omitted for the purpose of convenience of explanation.

As shown in FIGS. 2A and 2B, the pixel 101 is formed on a substrate 10 made of insulating material, such as glass, by sequentially stacking a first wiring layer 12, a second wiring layer 14, and a light emitting element layer 16 from the lowest layer side. In FIG. 2A, a part of the second wiring layer 14 and the light emitting element layer 16 are also omitted for the purpose of explaining a structure of the first and second wiring layers.

The first wiring layer 12 includes signal lines (lines) 20 formed on the substrate 10 and plugs 22 to electrically connect the signal lines 20 and signal lines (described below) included in the second wiring layer. Further, insulating members (for example, silicon oxides, etc.) are formed between the respective signal lines 20 or the respective plugs 22. Further, the insulating members are omitted in FIG. 2A.

The second wiring layer 14 includes signal lines (lines) 30 formed on the first wiring layer 12, plugs 32 to electrically connect the signal lines 30 and electrodes (described below) included in the light emitting element layer 16, a chip 34 to drive the light emitting element layer 16, and a pad group 38 including a plurality of pads 36 to electrically connect the chip 34 to the signal lines 30. Further, although omitted in FIG. 2A, insulating members (for example, silicon oxides, etc.) are formed between the respective signal lines 30 or the respective plugs 32. Furthermore, although the chip 34 is omitted in FIG. 2A, the chip 34 is formed on the aforementioned pad group 38.

In this exemplary embodiment, the aforementioned chip 34 includes a plurality of thin film transistors, and controls independently the respective color pixels 1, 2, 3 included in one pixel 101. The chip 34 is formed by forming the chips 34 on a substrate (a transfer origin substrate) other than the substrate 10 and peeling off the chips from the transfer origin substrate to transfer them onto the substrate 10. Details of the transfer method are described below.

The light emitting element layer 16 includes three pixel electrodes 40 formed on the second wiring layer 14, a common electrode 42 formed to be opposite to the pixel electrodes 40, three light emitting layers 44 formed between the respective pixel electrodes 40 and the common electrode 42, and a protective layer 46 formed on the common electrode 42. Further, insulating members (for example, silicon oxides, etc.) are formed between the respective pixel electrodes 40 or the respective light emitting layers 44. The respective pixel electrodes 40, the respective light emitting layers 44 stacked thereon and the common electrode 42 constitute the three-color pixels 1, 2, 3. Since currents are independently supplied to the respective light emitting layers 44 through the respective pixel electrodes 40 by the aforementioned chip 34, the respective color pixels 1, 2, 3 are independently switched.

Like the above, since by forming intensively drive circuits for the three-color pixels as one chip 34, the number of chips to be a target for transfer is reduced into ⅓ compared with a case in which thin film transistors are individually transferred for the respective color pixels 1, 2, 3 and thus the number of transfers can be reduced into ⅓, it is possible to enhance the production yield. Furthermore, the chip 34 corresponds to the "basic-pixel driving chip" and the "transferred chip".

A specific example of an internal structure of the chip 34 of this exemplary embodiment is described in details below.

Figure 3:
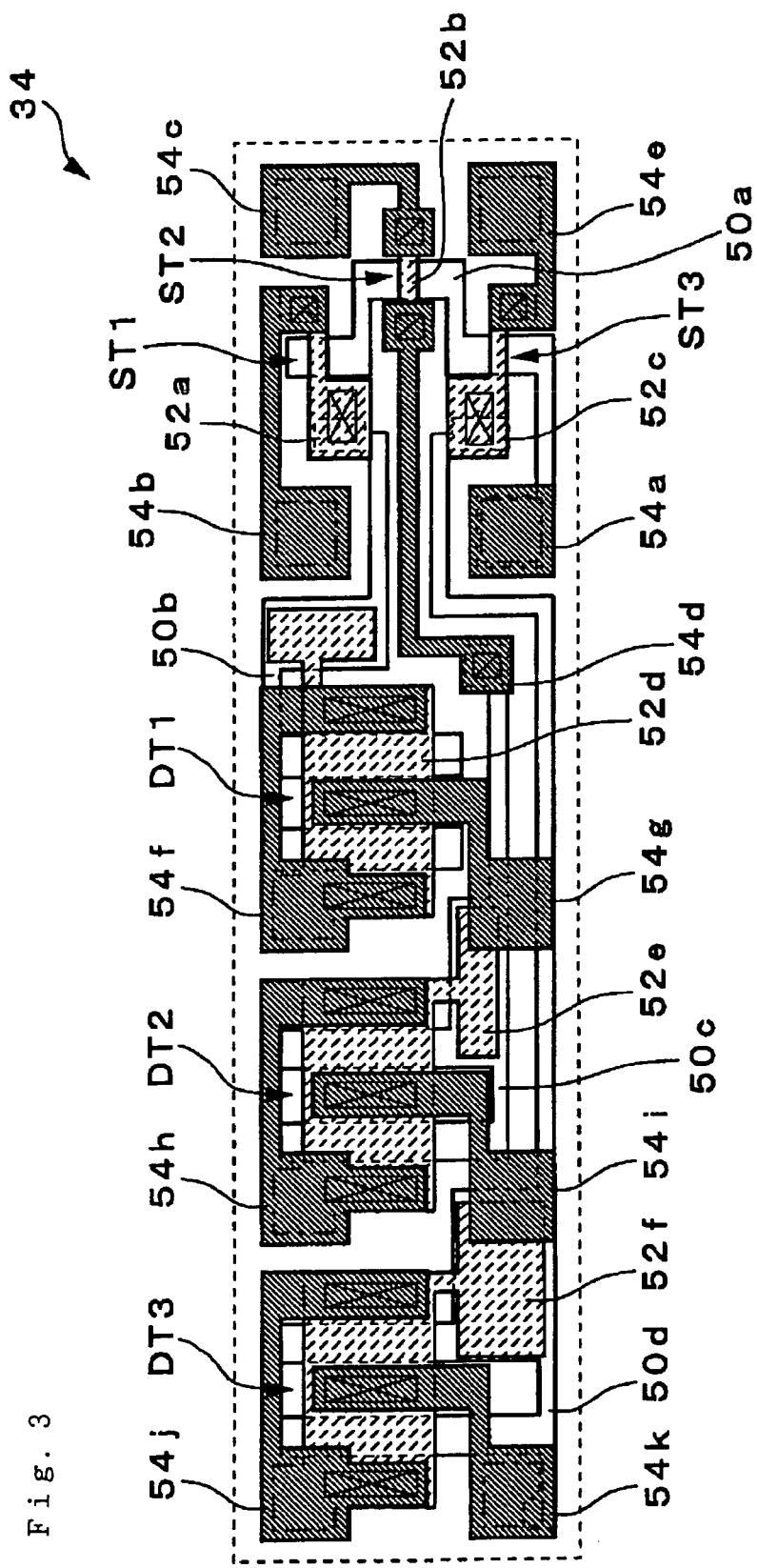
FIG. 3 is a plan view illustrating an internal structure of a chip.

FIG. 3 is a plan view illustrating an internal structure of the chip 34. In FIG. 3, in order to facilitate the understandings of structures of thin film transistors (TFTs) or lines included in the chip 34, elements provided on a top surface of the thin film transistors are omitted. The elements, which are omitted, are described below.

As shown in FIG. 3, the chip 34 includes three switching thin film transistors ST1, ST2, ST3 arranged vertically at the right side, and three driving thin film transistors DT1, DT2, DT3 arranged horizontally at the left side.

In this exemplary embodiment, a pixel circuit constructed by combining one switching thin film transistor and one driving thin film transistor drives one color pixel. Specifically, the switching thin film transistor ST1 shown in FIG. 3 operates the driving thin film transistor DT1 in accordance with an input signal (a scanning signal). The driving thin film transistor DT1 controls a current flowing in the light emitting layer 44 constituting the color pixel 1. Similarly, the pixel circuit constructed by combining the switching thin film transistor ST2 and the driving thin film transistor DT2 controls a current flowing in the light emitting layer 44 constituting the color pixel 2. Furthermore, the pixel circuit constructed by combining the switching thin film transistor ST3 and the driving thin film transistor DT3 controls a current flowing in the light emitting layer 44 constituting the color pixel 3.

The respective switching thin film transistors and the respective driving thin film transistors described above include a first wiring layer and a semiconductor film to form an active region of a thin film transistor. Furthermore, the respective switching thin film transistors and the respective driving thin film transistors described above further include a semiconductor layer formed on the first wiring layer and a second wiring layer formed on the semiconductor layer. In FIG. 3, for the purpose of easily understanding the respective layers, the first wiring layer is indicated by a white color against a black background, the semiconductor layer is indicated by a coarse hatching inclined downwardly, and the second wiring layer is indicated by a fine hatching inclined upwardly. Further, insulating layers made of SiO2 are formed between the respective layers.

Figure 4A:
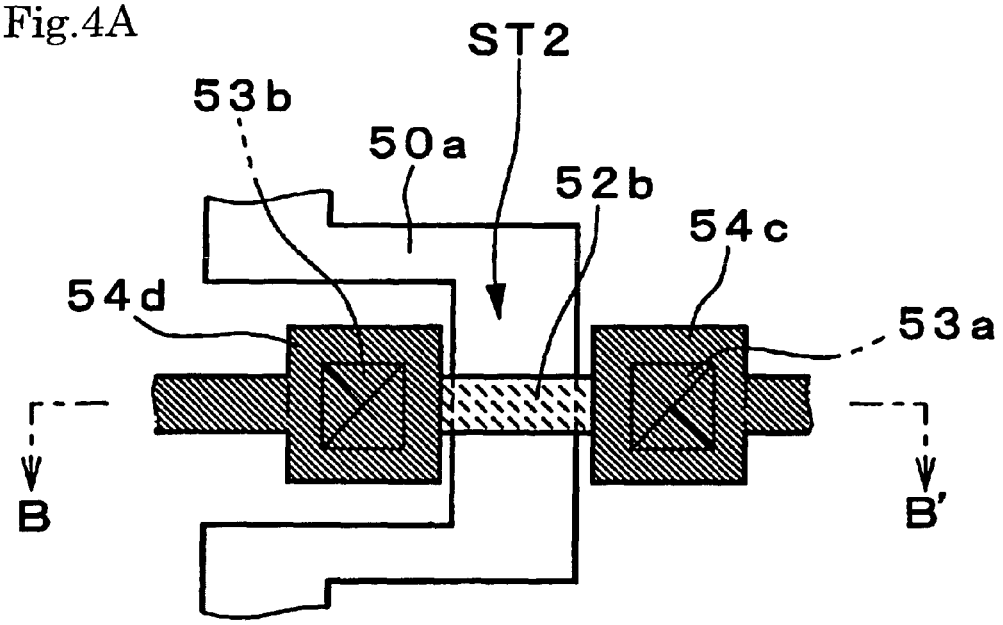
FIGS. 4A and 4B are schematics illustrating a layer structure of the chip.
Figure 4B:
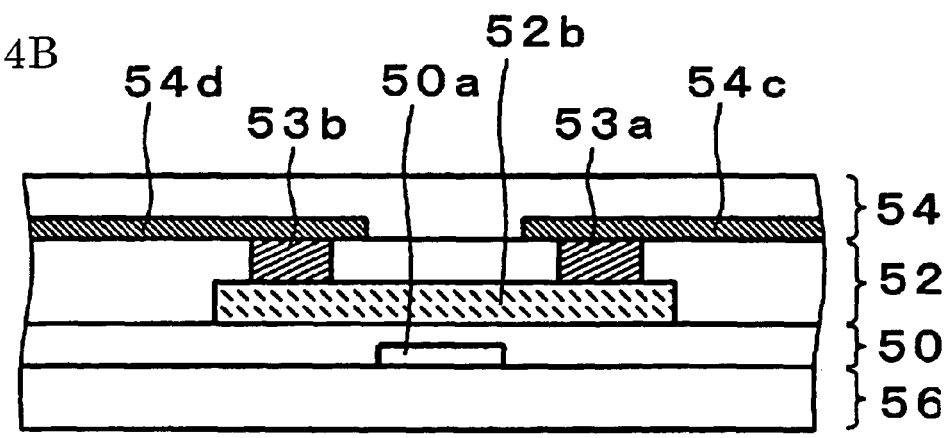

FIGS. 4A and 4B are schematics illustrating a layer structure of the chip 34. FIG. 4A, is a plan view of an exemplary switching thin film transistor ST2, and FIG. 4B is a cross-sectional view taken along a plane B–B' of FIG. 4A.

As shown in FIG. 4B, the chip 34 is constructed by sequentially stacking a first wiring layer 50, a semiconductor layer 52, and a second wiring layer 54 on a base substrate 56. The first wiring layer 50 includes a line 50a serving as a gate electrode of the switching thin film transistor ST2. The semiconductor layer 52 includes a semiconductor film 52b serving as an active region of the switching thin film transistor ST2, and plugs 53a, 53b to electrically connect the semiconductor film 52b to the second wiring layer 54. The second wiring layer 54 includes lines 54c, 54d serving to supply current to source/drain regions of the switching thin film transistor ST2. Further, other thin film transistors, which are not shown, have also the same layer structure as the switching thin film transistor ST2 shown in FIGS. 4A and 4B.

Next, referring to FIG. 3, structures of the first wiring layer, the semiconductor layer, and the second wiring layer is described in further detail below.

The first wiring layer 50 includes lines 50a to 50d. The line 50a serves as a gate electrode of the respective switching thin film transistors ST1, ST2, ST3, and also are electrically connected to a line 54a included in the second wiring layer. By supplying a scanning signal to the line 50a through the line 54a, operations of the respective switching thin film transistors ST1, ST2, ST3 can be controlled.

Further, although not shown in FIG. 3, the line 54a is electrically connected to a pad (a connection terminal serving for an electrical connection) provided above the second wiring layer, and the scanning signal is transmitted from outside of the chip 34 to the line 54a through the pad. Details of this pad are described below. In this exemplary embodiment, like above, by forming the lines to supply scanning signals to the respective switching thin film transistors ST1, ST2, ST3 as one common line, area required for formation of the first wiring layer can be decreased and also the number of pads can be reduced, so that the size of the chip 34 can be reduced. Furthermore, by reducing the number of pads (in other words, connecting positions), the frequency at which connection failure occurs in transferring can be reduced. From this point of view, it is also possible to enhance the production yield or to reduce the manufacturing cost.

The line 50b is electrically connected to the semiconductor film 52a, has a function of transmitting the current supplied from the switching thin film transistor ST1 to the driving thin film transistor DT1, and also serves as a gate electrode of the driving thin film transistor DT1.

The line 50c is electrically connected to the semiconductor film 52b through line 54d included in the second wiring layer, has a function of transmitting the current supplied from the switching thin film transistor ST2 to the driving thin film transistor DT2, and also serves as a gate electrode of the driving thin film transistor DT2.

The line 50d is electrically connected to the semiconductor film 52c, has a function of transmitting the current supplied from the switching thin film transistor ST3 to the driving thin film transistor DT3, and also serves as a gate electrode of the driving thin film transistor DT3.

The semiconductor layer 52 includes semiconductor films 52a to 52f. The semiconductor film 52a, one end of which is connected to the line 54b and the other end of which is connected to the line 50b, serves as an active region of the switching thin film transistor ST1. The semiconductor film 52b, one end of which is connected to the line 54c and the other end of which is connected to the line 54d, serves as an active region of the switching thin film transistor ST2. The semiconductor film 52c, one end of which is connected to the line 54e and the other end of which is connected to the line 50d, serves as an active region of the switching thin film transistor ST3.

The semiconductor film 52d is connected to the respective lines 54g, 54f, is also connected to a pad (not shown herein) described below and serves as an active region of the driving thin film transistor DT1. The semiconductor film 52e is connected to the respective lines 54h, 54i, is also connected to a pad (not shown herein) described below, and serves as an active region of the driving thin film transistor DT2. The semiconductor film 52f is connected to the respective lines 54j, 54k, is also connected to a pad (not shown herein)

described below, and serves as an active region of the driving thin film transistor DT3.

The second wiring layer 54 includes lines 54a to 54k. Pads formed above the second wiring layer 54 and serving to electrically connect the internal circuit of the chip 34 to an external device are described below, including the connection relations to the lines 54a to 54k.

Figure 5:
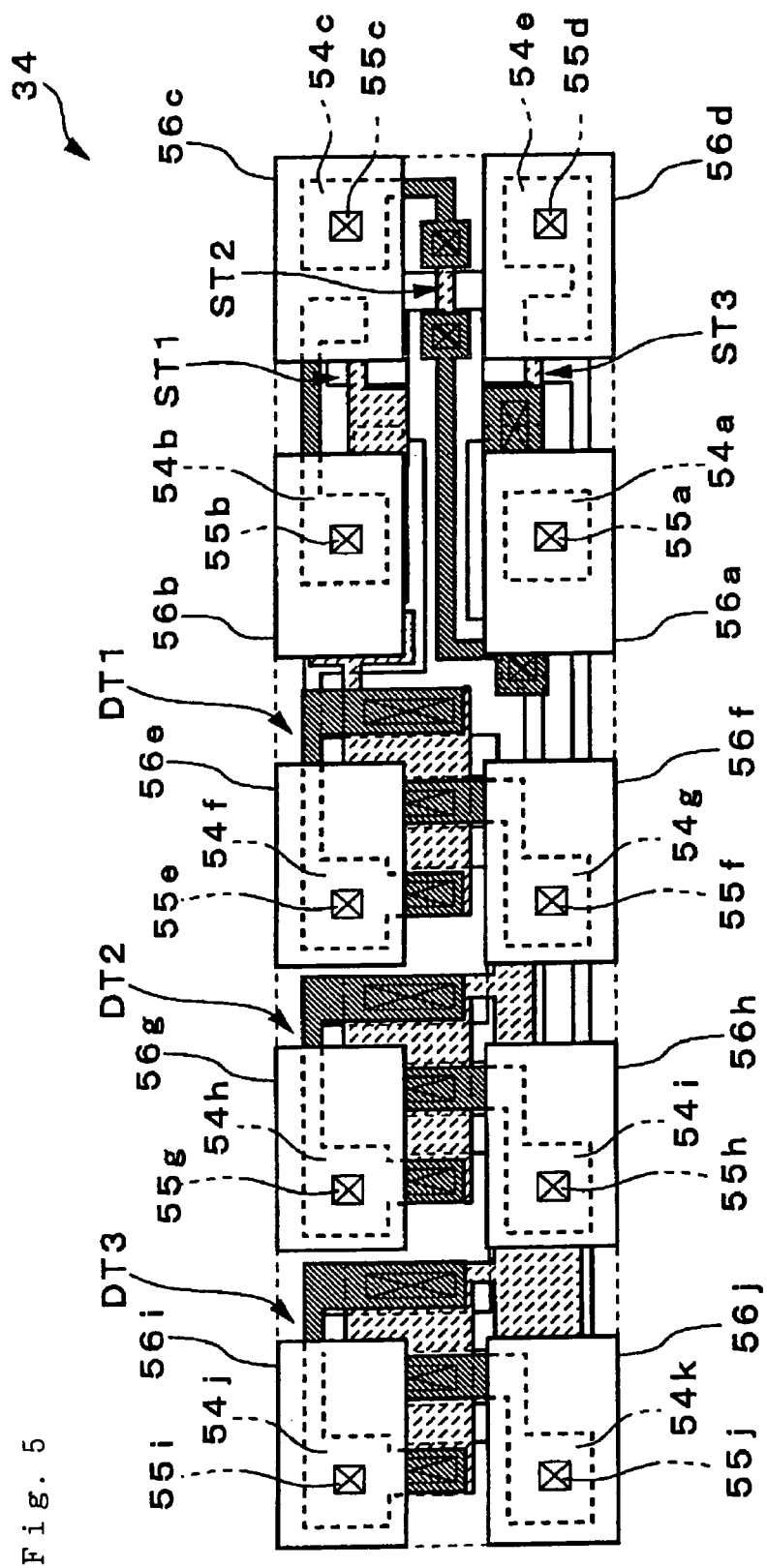
FIG. 5 is a schematic illustrating a pad.

FIG. 5 is a schematic illustrating the pads. As shown in FIG. 5, ten pads 56a to 56j are provided above the second wiring layer 54 of the chip 34. In this exemplary embodiment, each pad 56a, etc., is formed as a projection portion having a rectangular shape. These pads 56a to 56j are constructed to correspond to the respective pads 36 (see FIGS. 2A and 2B) included in the aforementioned pixel 101 one to one. The chip 34 is bonded in a state in which the chip 34 shown in FIG. 5 is inversed and thus the respective pads 56a to 56j are opposite to the respective pads 36 of the pad group 38 included in the pixel 101 shown in FIG. 2 described above. The bonding method of the chip 34 is described below.

The pad 56a is electrically connected to the line 54a through the plug 55a. By supplying a scanning signal to the line 54a through the pad 56a from an external device, the switching transistors ST1 to ST3 are driven.

The pad 56b is electrically connected to the line 54b through the plug 55b. By externally supplying a current to the line 54b through the pad 56b, the active region of the switching thin film transistor ST1 is supplied with the current.

The pad 56c is electrically connected to the line 54c through the plug 55c. By externally supplying a current to the line 54c through the pad 56c, the active region of the switching thin film transistor ST2 is supplied with the current.

The pad 56d is electrically connected to the line 54e through the plug 55d. By externally supplying a current to the line 54e through the pad 56d, the active region of the switching thin film transistor ST3 is supplied with the current.

The pad 56e is electrically connected to the line 54f through the plug 55e. By externally supplying a current to the line 54f through the pad 56e, the active region of the driving thin film transistor DT1 is supplied with the current.

The pad 56f is electrically connected to the line 54g through the plug 55f. The pad 56f is electrically connected to one of the aforementioned pads 36. Furthermore, the current output from the driving thin film transistor DT1 is supplied to the color pixel 1 through the line 54g, the plug 55f, the pad 56f and the pad 36 electrically connected to the pad 56f.

The pad 56g is electrically connected to the line 54h through the plug 55g. By externally supplying a current to the line 54h through the pad 56g, the active region of the driving thin film transistor DT2 is supplied with the current.

The pad 56h is electrically connected to the line 54i through the plug 55h. The pad 56h is electrically connected to one of the aforementioned pads 36. Furthermore, the current output from the driving thin film transistor DT2 is supplied to the color pixel 2 through the line 54i, the plug 55h, the pad 56h and the pad 36 electrically connected to the pad 56h.

The pad 56i is electrically connected to the line 54j through the plug 55i. By externally supplying a current to the line 54j through the pad 56i, the active region of the driving thin film transistor DT3 is supplied with the current.

The pad 56j is electrically connected to the line 54k through the plug 55j. The pad 56j is electrically connected to one of the aforementioned pads 36. Furthermore, the current output from the driving thin film transistor DT3 is supplied to the color pixel 3 through the line 54k, the plug 55i, the pad 56i and the pad 36 electrically connected to the pad 56i.

Next, arrangement of the ten pads 56a to 56j provided on the chip 34 and the ten pads 36 provided to correspond to the pads 56a to 56j one to one is described below. Since the respective pads 56a to 56j are arranged similarly to the respective pads 36, only the arrangement of the pads 56a to 56j provided on the chip 34 is described and descriptions of the pads 36 are omitted.

FIGS. 6A and 6B are schematics illustrating the arrangement of the respective pads provided on the chip 34. FIG. 6A is a schematic illustrating an arrangement of pads according to this exemplary embodiment.

Further, FIG. 6B is a schematic illustrating an arrangement of pads according to a comparison example.

As shown in FIG. 6A, the respective pads 56a to 56j are arranged such that five pads are arranged in a longitudinal direction (shown as an X direction) of the chip 34 and two pads are arranged in an Y direction perpendicular to the longitudinal direction (5×2 array). The respective pads are arranged apart from one another by a predetermined distance (10 μm in the shown example) properly established in consideration of various conditions in design or manufacture.

Like the above, by arranging the respective pads in two lines along one direction of the chip 34, it is possible to reduce the area of the chip 34 compared with a case in which the respective pads are arranged in three lines as shown in FIG. 6B or arranged in three or more, so that it is possible to reduce the manufacturing cost. This point of view is described below using a more specific example having the numerals exemplified in FIGS. 6A and 6B.

In the specific example shown in FIGS. 6A and 6B, the number of pads 56a to 56j is 10, a size of each pad is 24 μm×15 μm, and a gap between the respective pads is 10 μm. Further, these numerals are determined in consideration of performance of the manufacturing process, designs or the like, but do not restrict the present invention.

As shown in FIG. 6A, the area of the chip 34 when the respective pads are arranged in two lines is 6400 μm2 (=160 μm×40 μm), and the area of the chip 34 when the respective pads are arranged in three lines is 8190 μm2 (=126 μm×65 μm). From this result, it can be known that the area of the chip 34 is reduced by arranging the respective pads in two lines.

The chip 34 according to this exemplary embodiment has the aforementioned configuration, and a method of manufacturing an organic EL display device according to this exemplary embodiment are described below. In this exemplary embodiment, a transfer technique in which a plurality of chips 34 described above is formed on a transfer origin substrate, and thereafter the chips 34 are peeled off from the first substrate to transfer the chips onto a substrate constituting the organic EL display device, is employed. A method of transferring the chips 34 is mainly described in detail below.

FIGS. 7A–8C are schematics illustrating the manufacture method according to this exemplary embodiment. The transfer method includes first to fifth steps described below.

<First Process>

Figure 7A:
FIGS. 7A–7E are schematics illustrating a manufacturing method according to an exemplary embodiment.

In the first process, as shown in FIG. 7A, a peeling layer (light-absorbing layer) 62 is formed on a transfer origin substrate 60.

It is preferable that the transfer origin substrate 60 have a light transmitting property such that a light can pass through it. By doing so, a light can be irradiated to the peeling layer through the transfer origin substrate to separate the peeling layer rapidly and accurately by the light irradiation. In this case, it is preferable that the light transmittance be 10% or more and it is more preferable that the light transmittance be 50% or more. This is because light loss is decreased with increase of the transmittance and thus less quantity of light is required for separating the peeling layer 62.

Further, it is preferable that the transfer origin substrate 60 be made of material having a high reliability, and it is more preferable that it be made of material excellent in heat resistance. For example, when the chips 34 are formed as transferred bodies, the process temperature may be increased (for example, about 350 to 1000° C.) depending upon their kinds or methods of forming the same. In this case, the excellent heat resistance of the transfer origin substrate 60 can also increase a range of film forming conditions such as temperature or the like in forming the chips 34 on the transfer origin substrate 60. By doing so, it is possible to perform a desired high-temperature process when a plurality of chips is formed on the transfer origin substrate, so that elements or circuits having high reliability and high performance can be manufactured.

Therefore, it is preferable that when the maximum temperature in forming the chips 34 is Tmax, the transfer origin substrate 60 be made of material having a strain point of Tmax or more. Specifically, the material constituting the transfer origin substrate 60 has preferably a strain point of 350° C. or more, and more preferably 500° C. or more. This material includes heat resistant glass, such as quartz glass, Corning 7059, and NEC Glass OA-2.

Furthermore, although the thickness of the transfer origin substrate 60 is not particularly limited, it should preferably be about 0.1 to 5.0 mm, and more preferably about 0.5 to 1.5 mm. This is because light loss is less likely to occur in cases where a thicker transfer origin substrate 60 has a greater strength and a thinner transfer origin substrate 60 has a lower transmittance.

Furthermore, the transfer origin substrate 60 with a higher light transmittance may be thicker than the aforementioned maximum range. Furthermore, it is preferable that the transfer origin substrate 60 have a uniform thickness in order to allow uniform light radiation.

The transfer origin substrate as described above involves a number of conditions, but because the transfer origin substrate can be used repeatedly unlike transfer destination substrates to be final products, even if the material is relatively expensive, it is possible to reduce or minimize increase in manufacturing cost by reusing the material.

A material that results in separation within the layer and/or at the interface (hereinafter, "intra-layer separation" and/or "interfacial separation") when absorbing irradiated light should be selected for the peeling layer 62. It is preferable that the light irradiation should eliminate or diminish the bonding force between the atoms or molecules in the material forming the peeling layer 11, that is, result in ablation to cause the intra-layer separation and/or the interfacial separation.

Furthermore, the light irradiation may result in the release of gas from the peeling layer 62, leading to separation. That is, a component contained in the peeling layer 62 may be gasified and then released, and the peeling layer 62 may be temporarily gasified by absorbing the light, so that the vapor thereof is released to contribute to separation. A composition of the peeling layer 62 includes, for example, the following materials listed in A to F below.

(A) Amorphous Silicon (a-Si)

The amorphous silicon may contain hydrogen (H). In this case, the H content is preferably about 2 atomic percent or more, and more preferably about 2 to 20 atomic percent.

(B) Various Oxide Ceramics, Dielectrics (Ferroelectrics) or Semiconductors, such as Silicon Oxide or Silicon Oxide Compounds, Titanium Oxide or Titanium Oxide Compounds, Zirconium Oxide or Zirconium Oxide Compounds, Lanthanum Oxide or Lanthanum Oxide Compounds (C) Ceramics or Dielectrics (Ferroelectrics), such as PZT, PLZT, PLLZT, and PBZT (D) Nitride Ceramics, such as Silicon Nitride, Aluminum Nitride, and Titanium Nitride (E) Organic Polymer Materials The organic polymer materials preferably include bonds, such as —CH—, —CO— (Ketones), —CONH— (Amides), —NH— (Imides), —COO— (Esters), —N=N— (Azo) and —CH=N— (Schiff) (Such bonds are cleaved by the light radiation), and more preferably, an abundance of such bonds. Further, the organic polymer materials may have aromatic hydrocarbons (one or more benzene rings or condensed rings thereof) in the structural formula.

Specific examples of such organic polymer materials include polyolefin, such as polyethylene and polypropylene, and polyimides, polyamides, polyesters, polymethyl methacrylates (PMMA), polyphenylene sulfides (PPS), polyether sulfones (PES) and epoxy resins.

(F) Metals

The metals include for example, Al, Li, Ti, Mn, In, Sn, Y, La, Ce, Nd, Pr, Gd, Sm or alloys containing at least one metal among the above. The peeling layer can be made of an alloy containing hydrogen. That is because exposing a peeling layer made of an alloy containing hydrogen to light will result in the release of the hydrogen, thereby promoting the separation of the peeling layer.

Furthermore, the peeling layer can be made of an alloy containing nitrogen. That is because exposing a peeling layer made of an alloy containing nitrogen to light will result in the release of the nitrogen, thereby promoting the separation of the peeling layer. Furthermore, the peeling layer may include a multilayer film. A multilayer film can be formed, for example, by stacking an amorphous silicon film and a metal film formed thereon. Materials for the multilayer film can include at least one material from among the aforementioned ceramics, metals, and organic polymer materials.

A method of forming the peeling layer 62 is not particularly limited, but may be selected in accordance with various conditions, such as the film composition and the film thickness. Examples of the method of forming the peeling layer include various vapor phase film-forming methods, such as CVD and sputtering, various types of plating methods, coating methods, such as spin coating or the like, various types of printing methods, transfer methods, ink jet coating methods and powder jet methods, and combinations of two or more of the above.

Furthermore, although not shown in FIG. 7A, an intermediate layer may be provided between the transfer origin substrate 60 and the peeling layer 62 for the purpose of enhancement of close adherence between both, in accordance with features of the transfer origin substrate 60 and the peeling layer 62. The intermediate layer has at least one of, for example, functions as a protective layer for physically or chemically protecting the transferred layer at the time of manufacture or use, an insulating layer, a barrier layer to reduce or prevent components from being diffused (migration) to or from the transferred layer and a reflective layer.

<Second Process>

Figure 7B:
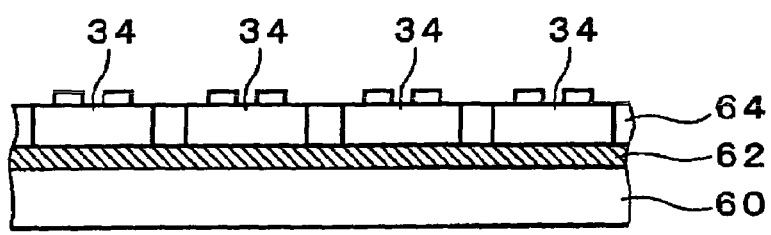

A second process is described below. In the second process, as shown in FIG. 7B, a plurality of chips 34 is formed on the peeling layer 62. A layer including the plurality of chips 34 is referred to as a transferred layer 64. The respective chips 34 include six thin film transistors as described above.

High temperature processes to some extent are required for manufacturing the thin film transistors, and a base substrate on which the thin film transistors are formed has to satisfy various conditions similarly to the transfer origin substrate.

In the manufacturing method of this exemplary embodiment, after manufacturing the thin film transistors on the transfer origin substrate satisfying various manufacture conditions, it is possible to transfer the thin film transistors onto a final substrate not satisfying the manufacture conditions. That is, according to manufacturing method of this exemplary embodiment, since a substrate made of cheaper materials can be used as the final substrate, it is possible to reduce the manufacturing cost, and since a flexible substrate having flexibility can be used, it is possible to broaden a range of selecting the final substrate.

Separation of the respective chips 34 in the transferred layer 64 is described below. As the method of separating the respective chips 34, a method of separating the respective chips by etching, a method of not providing a particular structure for separation, a method of separating only a peeling layer, a method of facilitating the separation into the individual transferred bodies by forming a predetermined structure on the transfer origin substrate and so on can be used. The method of completely separating the individual chips 34 is described below.

Figure 7C:
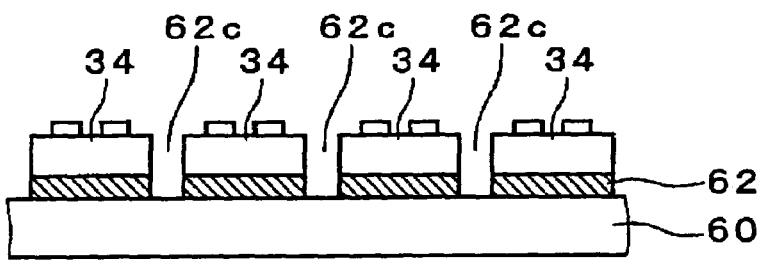
Figure 7D:
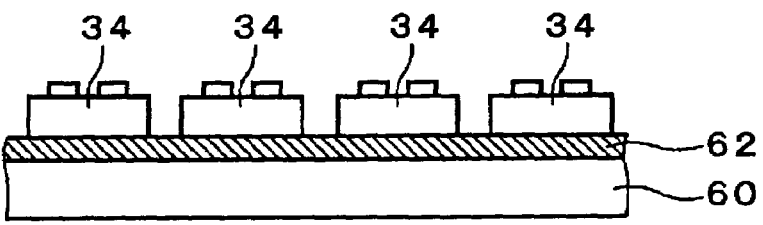

As shown in FIG. 7C, in order to individually separate the chips 34, grooves 62c having a trenched structure are formed in circumferential edges of regions corresponding to the chips 34 by a wet etching or a dry etching to leave the respective chips 34 in island shapes. These grooves 62c cut out the overall transferred layer 64 and the overall (see FIG. 7C) or partial (see FIG. 7D) peeling layer 62 in the thickness direction of the substrate. The cutting may be performed only to the transferred layer 64 more shallowly. Theses grooves 62c may be formed not only by etching a part of the peeling layer 62 as shown in FIG. 7D, but also by completely etching the peeling layer 62 as shown in FIG. 7C, to leave the respective chips 34 and the peeling layer 62 right under the chips in the same island shapes. By forming the same chips 34 and etching them at the same pitch to arrange the respective transferred bodies on the transfer origin substrate 60, it is facilitated to transfer only the desired chips 34 in a peeling process (fourth and fifth processes described below).

Since a part of the peeled body can be clearly separated in accordance with its shape by cutting out the transferred layer 62 in advance, it is possible to reduce or prevent the corresponding regions from being destroyed. Furthermore, it is possible to reduce or prevent fractures of the transferred layer 62 following the separation from affecting its adjacent regions. Furthermore, by carrying out the cutting in the film thickness direction in advance, even when the adhesive force of the adhesive layer to attach specific chips 34 to the transfer destination base substrate is small, it is possible to peel off the chips 34. Furthermore, since the external appearance of the regions to be targets for transfer is clear, positioning between the substrates in transfer can be facilitated.

Figure 7E:
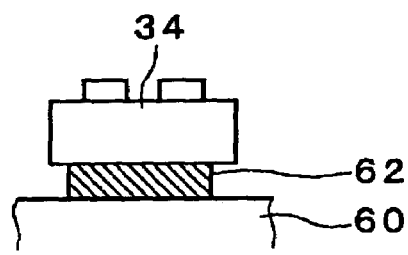

Furthermore, as shown in FIG. 7E, the peeling layer may be over-etched such that the adhesive area of the peeling layer 62 to the chip 34 becomes smaller than the overall area of an adhesive surface of the transferred body to the peeling layer. Since the area of the peeling layer 62 becomes smaller by over-etching the peeling layer, the separation can be surely executed with only a small force by the light irradiation to the peeling layer 62, and by decreasing the area of the peeling layer 62, the quantity of light energy required for separation can be decreased.

Furthermore, as shown in FIG. 7D, by etching only the transferred layer 64 to form the grooves 62c, the peeling layer 62 may be left to be continuous. Only if sufficient energy can be applied to regions in which the chips 34 are formed, the peeling layer 62 in the regions can be surely separated. For this reason, even if the grooves are not formed in the peeling layer 62, it is possible to peel off only the desired transferred bodies.

<Third Process>

Figure 8A:
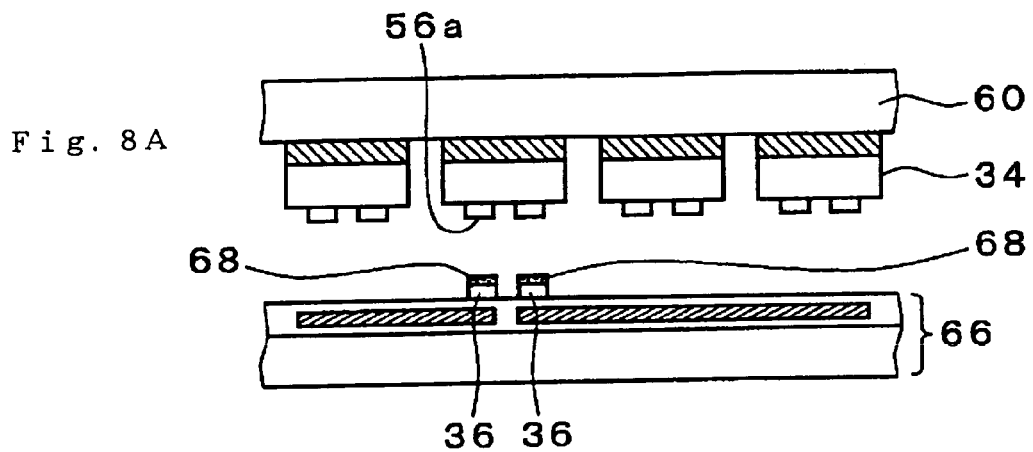
FIGS. 8A–8C are schematics illustrating a manufacturing method according to an exemplary embodiment.

Next, as shown in FIG. 8A, by aligning and overlapping a surface, of the transfer origin substrate 60, in which the chips 34 are formed and a surface, of the transfer destination substrate 66, to which the chips 34 are transferred and then applying pressure as needed, only the chips 34 to be transferred is selectively attached to the transfer destination substrate 66 through the adhesive layer 68 having conductivity.

In this exemplary embodiment, the aforementioned substrate 10 (see FIGS. 2A and 2B) on which the first wiring layer 12 is formed and the signal lines 30 and the pads 36 are formed on the first wiring layer 12 corresponds to the transfer destination substrate 66 as shown FIG. 8A. Further, the respective pads 36 included in the transfer destination substrate 66 are brought into contact with the respective pads 56a to 56j provided on the chips 34 to be targets for transfer, and then the attachment of the chips 34 is performed.

Suitable examples of the adhesive constituting the aforementioned adhesive layer 68 can include various types of curing adhesives, such as reaction-curing adhesive, thermosetting adhesive, light-curing adhesive, such as ultraviolet-curing adhesive, anaerobe-curing adhesive. Furthermore, the adhesives may include, for example, any of epoxy adhesives, acrylate adhesives, silicon adhesives and so on. Furthermore, when adhesives in the market are used, the adhesives to be used may be adjusted to have a viscosity suitable for application thereof by adding proper solvent to the adhesives.

In this exemplary embodiment, the adhesive layer 68 is formed only on the chips 34 to be transferred or only in regions on the transfer destination substrate 66 corresponding to the chips 34 to be transferred. This local formation of the adhesive layer 68 can be performed by employing various printing methods or liquid ejection methods. The liquid ejection methods include a piezo-jet method of ejecting liquid using deformation of piezoelectric bodies and a method of ejecting liquid by generating bubbles from heating. In this exemplary embodiment, the adhesive layer 68 is formed, for example, using an ink-jet coating (liquid ejection) method.

<Fourth Process>

Figure 8B:
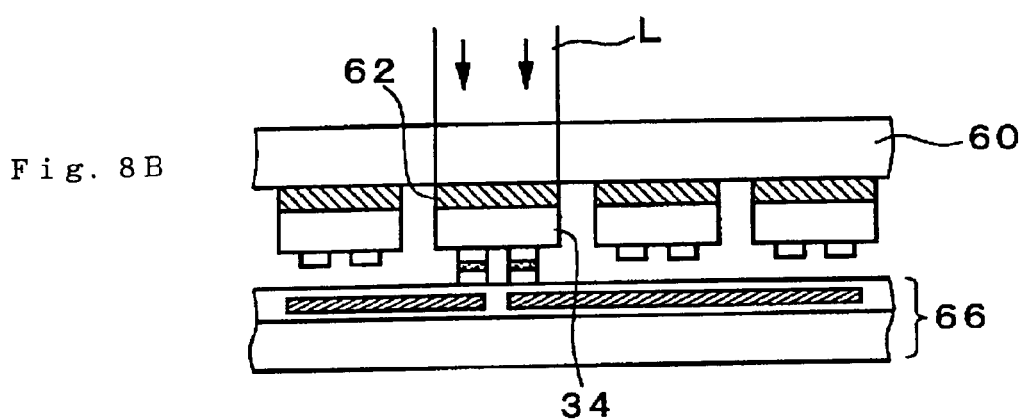

Next, as shown in FIG. 8B, by selectively irradiating light L only to the peeling layer 62 of the chips 34 to be transferred from the transfer origin substrate 60 side of the attachment body of the transfer origin substrate 60 and the transfer destination substrate 66, the separation (the intra-layer separation and/or the interfacial separation) can occur only in the peeling layer 62 supporting the chips 34 to be transferred.

The intra-layer separation and/or the interfacial separation of the peeling layer 62 results from generation of ablation in the material constituting the peeling layer 62, and phase transformations, such as release of gas contained in the peeling layer 62, dissolution or transpiration occurring right after the light irradiation.

Here, the "ablation" means that the fixing material (a material constituting the peeling layer 62) having absorbed the irradiated light is excited photo-chemically or thermally and thus the bonding between atoms or molecules of the surface or inner part thereof is disconnected to release the atoms or molecules, and mainly means that all or a part of materials constituting the peeling layer 62 causes the phase transformation, such as dissolution or transpiration (gasification). Further, a fine-bubbled state can result from the phase transformation to reduce the adhesive force.

Whether the peeling layer 62 undergoes the intra-layer separation, the interfacial separation, or both is governed by the composition of the peeling layer 62 and various other factors, examples of which include conditions, such as the type of light that is irradiated, its wavelength, its intensity, and the depth to which it reaches.

The light L that is irradiated may be any that brings about the intra-layer separation and/or the interfacial separation in the peeling layer 62, such as X-ray, UV-ray, visible light, IR-ray, laser light.

Among them, the laser light is preferred because it readily produces separation (ablation) in the peeling layer 62 and is capable of high-precision irradiation of certain areas. The laser light with a wavelength of 100 nm to 350 nm is preferred. The use of such short wavelength laser light can provide higher irradiation precision and more effective separation in the peeling layer 62.

As a laser apparatus for generating such laser light, excimer laser is used very suitably. Since the excimer laser outputs a high energy laser light in the short wavelength region, the ablation can be generated in the peeling layer 62 for a very short time, and thus it is possible to separate the peeling layer 62 without almost causing increase in temperature of the transfer destination substrate 66 or the first substrate 60 which is adjacent and without causing damage, such as deterioration in the chips 34.

When the phase transformation, such as gas release, gasification or sublimation is caused in the peeling layer 62, leading to separation, it is preferable that the wavelength of the laser light to be irradiated be about 350 nm to 1200 nm. Since laser light sources or illumination devices which are widely used in the field of general processing, such as YAG and gas lasers, can be used for laser light with such a wavelength, the light irradiation can be performed inexpensively and simply. Further, by using such laser light with a wavelength in the visible light region, a degree of freedom in selecting the transfer origin substrate 60 can be increased, as long as the transfer origin substrate 60 is permeable to visible light.

Furthermore, the energy density of the laser light to be irradiated, particularly the energy density in the case of excimer lasers, should be preferably about 10 to 5000 mJ/cm2, and more preferably about 100 to 500 mJ/cm2. Furthermore, the irradiation time should be preferably about 1 to 1000 nsec, and more preferably about 10 to 100 nsec. A higher energy density or longer irradiation time will more readily result in ablation, whereas a lower energy density or shorter irradiation time can minimize the risk of adverse effects on chips 34 or the like by the irradiated light passing through the peeling layer 62.

<Fifth Process>

Figure 8C:
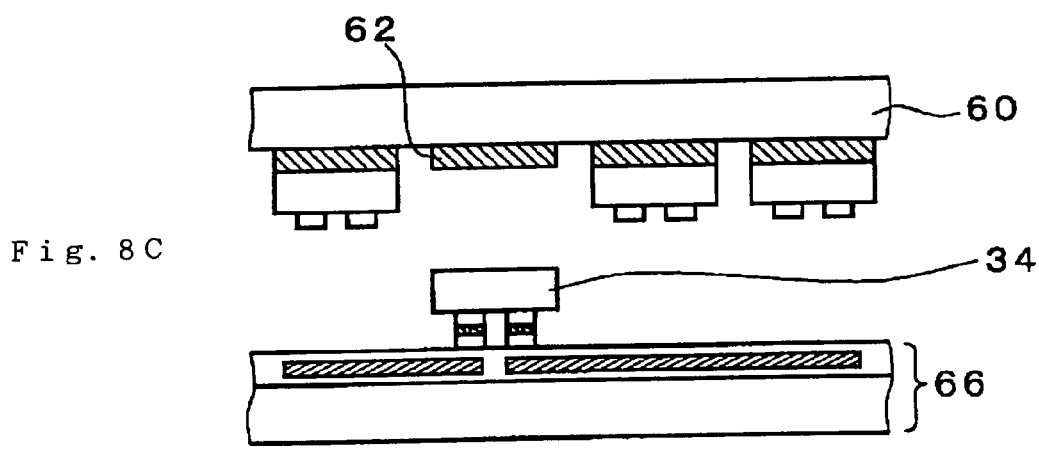

Next, as shown in FIG. 8C, when a force is applied to the transfer origin substrate 60 and the transfer destination substrate 66 in a direction in which they are apart from each other, the transfer origin substrate 60 is separated from the transfer destination substrate 66. Since the peeling layer 62 of the chips 34 to be transferred to the transfer destination substrate 66 is peeled off from the chips 34, the chips 34 to be transferred are cut off from the transfer origin substrate 60 side, through the fourth process. Furthermore, the chips 34 to be transferred are attached to the transfer destination substrate 66 through the adhesive layer 68.

Furthermore, in the fourth process, it is preferable that the peeling layer 62 be peeled off completely, but the peeling layer 62 may be peeled off partially only if the bonding intensity of the chips 34 to be transferred to the adhesive layer 68 is larger than the bonding force by the remaining peeling layer 62 and as a result, when the transfer origin substrate 60 is separated from the transfer destination substrate 66, the chips 34 to be transferred can be surely transferred to the transfer destination substrate 66.

Like this, whether the transferred bodies can be transferred or not is determined by a relative force relation between the bonding force of the peeling layer weakened due to separation of the peeling layer and the bonding force of the adhesive layer applied to the transferred bodies. If the separation by the peeling layer is sufficient, it is possible to transfer the transferred bodies even when the bonding force of the adhesive layer is weak, but even if the separation by the peeling layer is not sufficient, it is possible to transfer the transferred bodies even when the bonding force of the adhesive layer is intensive.

As shown in FIG. 8C, by separating the transfer origin substrate 60 from the transfer destination substrate 66, the chips 34 are transferred to desired positions on the transfer destination substrate 66. Thereafter, by forming an insulating member covering the chips 34 or the like, the second wiring layer 14 which is shown in FIGS. 2A and 2B is formed, and by forming the light emitting element layers 16 on the second wiring layer 14, the organic EL display device 100 is formed.

Since residuals of the peeling layer 62 may be attached to the chips 34 transferred to the transfer destination substrate 66, it is preferable that theses residuals be removed completely. A proper method to remove the residuals of the peeling layer 62 can be selected and employed from methods, such as cleaning, etching, ashing, polishing or combinations thereof.

Similarly, when residuals of the peeling layer 62 are attached to the surface of the transfer origin substrate 60 after the chips 34 have been transferred, they can be removed similarly to the aforementioned transfer destination substrate 66. By doing so, the transfer origin substrate 60 can be provided for reuse (recycle) thereof. By reusing the transfer origin substrate 60, waste of the manufacturing cost can be prevented. This is specifically effective to use the transfer origin substrate 60 made of expensive material or rare material, such as quartz glass.

Like the above, in this exemplary embodiment, since the chips 34 combining the functions of driving the three-color pixels 1, 2, 3 included in one pixel 101, respectively, are formed on the transfer origin substrate 60 and then the transfer thereof is performed, the number of transfers is 1 every pixel 101. For this reason, since the number of transferred bodies can be reduced and thus the number of transfers can be reduced, the number of occurrences of transfer error can be reduced as much and thus it is possible to enhance the production yield.

A variety of electronic apparatuses including the organic EL display device 100 according to this exemplary embodiment is described below. FIGS. 9A–9D are schematics illustrating specific examples of electronic apparatuses to which the organic EL display device 100 according to this exemplary embodiment applies.

Figure 9A:
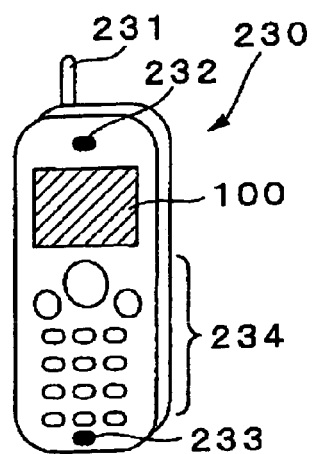
FIGS. 9A–9D are schematics illustrating a specific example of an electronic apparatus to which the organic EL display device can apply.

FIG. 9A is an example of application to a portable phone. A portable phone 230 includes an antenna unit 231, a voice output unit 232, a voice input unit 233, a manipulation unit 234, and the organic EL display device 100 according to this exemplary embodiment. Like this, the display device according to the present invention is usable as a display unit.

Figure 9B:
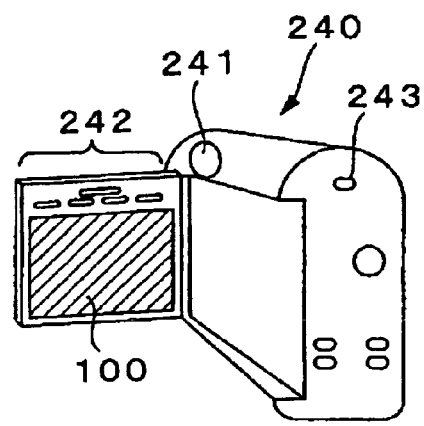

FIG. 9B is an example of application to a video camera. A video camera 240 includes an image reception unit 241, a manipulation unit 242, a voice input unit 243, and the organic EL display device 100 according to this exemplary embodiment. Like this, the display device according to the present invention is usable as a finder or a display unit.

Figure 9C:
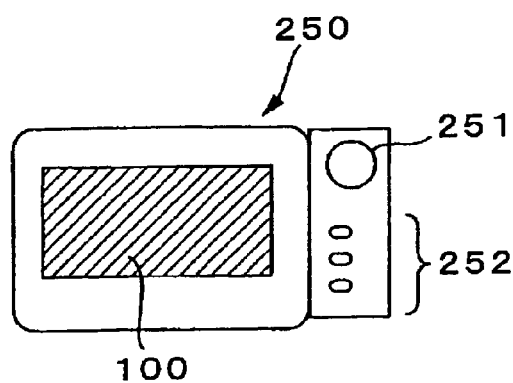

FIG. 9C is an example of application to a portable personal computer. A computer 250 includes a camera unit 251, a manipulation unit 252 and the organic EL display device 100 according to this exemplary embodiment. Like this, the display device according to the present invention is usable as a display unit.

Figure 9D:
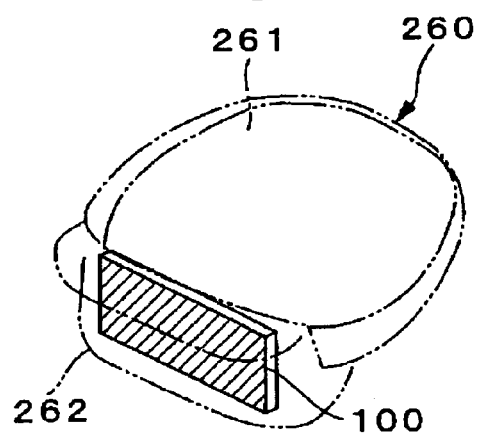

FIG. 9D is an example of application to a head mount display. A head mount display 260 includes a band 261, an optical system reception unit 262, and the organic EL display device 100 according to this exemplary embodiment. Like this, the display device according to the present invention is usable as an image display source.

Furthermore, the display device 100 according to the present invention is not limited to the aforementioned examples, but may apply to a variety of electronic apparatuses, such as a facsimile device having a display function, a finder of a digital camera, a portable TV, electronic organizers, or the like, for example.

Furthermore, the present invention is not limited to the aforementioned exemplary embodiment, but a variety of modifications can be made within a spirit of the present invention. For example, although in the aforementioned exemplary embodiment, the organic EL display device is described as an example of the electro-optical device according to the present invention, the present invention is not limited to this, but may apply to electro-employing optical devices employing various electro-optical elements (for example, plasma emission elements, electrophoresis elements, liquid crystal elements or the like, for example).

What is claimed is:

1. A method of manufacturing an electro-optical device, the method comprising:
    forming a plurality of chips each of which includes a drive circuit on a first substrate, a plurality of first connection terminals being formed on a same face of each of the plurality of chips;
    forming wires for connecting one of the plurality of chips with a plurality of pixel electrodes, wherein the plurality of pixel electrodes are formed on a second substrate; and
    transferring at least one of the plurality of chips from the first substrate onto the second substrate.

2. The method of manufacturing an electro-optical device according to claim 1, further comprising forming a plurality of pixel electrodes on the second substrate after the forming wires.

3. The method of manufacturing an electro-optical device according to claim 2, further comprising forming a plurality of electro-optical elements on the second substrate after the forming of the plurality of pixel electrodes.

4. The method of manufacturing an electro-optical device according to claim 1, the plurality of first connection terminals being arranged in a deposition of two lines.

5. The method of manufacturing an electro-optical device according to claim 1, the wires including a plurality of second connection terminals connected with pixel electrodes.

6. The method of manufacturing an electro-optical device according to claim 5, the transferring at least one of the plurality of chips including fixation of the plurality of chips by connecting each of the plurality of the first connection terminals with at least one of the plurality of the second connection terminals.

7. The method of manufacturing an electro-optical device according to claim 6, the transferring at least one of the chips including forming an adhesive layer on the first connection terminals or the second connection terminals.

8. The method of manufacturing an electro-optical device according to claim 1, the forming of the plurality of chips including forming a peeling layer between the plurality of chips and the second substrate.

9. The method of manufacturing an elector-optical device according to claim 8, the peeling layer being formed of a material having a bond that is weakened by application of an energy.

10. The method of manufacturing an electro-optical device according to claim 1, the drive circuit controlling a plurality of electro-optical elements.

11. The method of manufacturing an electro-optical device according to claim 10, the drive circuit including a first transistor for controlling current flowing in the at least one of the plurality of electro-optical elements and a second transistor for operating the first transistor in accordance with input signals.

12. The method of manufacturing an electro-optical device according to claim 10, the drive circuit including a plurality of first transistors for each of which controls current flowing in the at least one of the plurality of electro-optical elements and a plurality of second transistors whose gates are connected by a common line.

13. The method of manufacturing an electro-optical device according to claim 1, the drive circuit to drive a plurality of pixels individually.

14. The method of manufacturing an electro-optical device according to claim 1, the first substrate being formed of a material having a light transmitting property.

* * * * *